US 6,750,112 B2

(12) United States Patent
Kieslich

(10) Patent No.: US 6,750,112 B2
(45) Date of Patent: Jun. 15, 2004

(54) METHOD OF FORMING A BITLINE AND A BITLINE CONTACT, AND DYNAMIC MEMORY CELL INCLUDING A BITLINE AND BITLINE MADE CONTACT ACCORDING TO THE METHOD

(75) Inventor: Albrecht Kieslich, Radebeul (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/178,641

(22) Filed: Jun. 24, 2002

(65) Prior Publication Data
US 2003/0002359 A1 Jan. 2, 2003

(30) Foreign Application Priority Data
Jun. 22, 2001 (EP) .............................. 01115217

(51) Int. Cl.$^7$ ............................... H01L 21/20
(52) U.S. Cl. ..................................... 438/387
(58) Field of Search ................. 438/387, 241, 438/243, 257

(56) References Cited
U.S. PATENT DOCUMENTS

| | | | |
|---|---|---|---|
| 5,712,201 A | 1/1998 | Lee et al. ................ | 438/239 |
| 5,846,881 A | 12/1998 | Sandhu et al. ........... | 438/683 |
| 6,300,683 B1 * | 10/2001 | Nagasaka et al. ........ | 257/774 |
| 6,534,809 B2 * | 3/2003 | Moise et al. ............ | 257/295 |

FOREIGN PATENT DOCUMENTS

| | | |
|---|---|---|
| DE | 199 48 571 A1 | 4/2001 |
| EP | 0 730 298 A2 | 9/1996 |
| JP | 10 093 033 | 4/1998 |
| WO | WO 01/26139 A2 | 4/2001 |

OTHER PUBLICATIONS

"ULSI Technology", McGraw-Hill Companies, Inc., Singapore, 1996, pp. 443–444.

* cited by examiner

Primary Examiner—David Nelms
Assistant Examiner—Quoc Hoang
(74) Attorney, Agent, or Firm—Laurence A. Greenberg; Werner H. Stemer; Gregory L. Mayback

(57) ABSTRACT

A method of forming a bitline and a bitline contact and a dynamic random access memory (DRAM) cell array includes the following steps. The bitline and the bitline contact are formed in a two-step process, in which, first, the bitline contact is formed in a first dielectric layer and, then, the bitline of a conductive material having a lower resistivity than the bitline contact material is defined in a second dielectric layer (5). According to a preferred embodiment, the second dielectric layer (5) is made of a low k dielectric. The retention anneal process, which is usually performed in the standard DRAM process, is preferably made before depositing the bitline material and, optionally, the low k dielectric. A dynamic random access memory cell array having at least one bitline and a bitline contact can be manufactured by this method.

11 Claims, 5 Drawing Sheets

METHOD OF FORMING A BITLINE AND A
BITLINE CONTACT, AND DYNAMIC
MEMORY CELL INCLUDING A BITLINE
AND BITLINE MADE CONTACT
ACCORDING TO THE METHOD

BACKGROUND OF THE INVENTION

Field of the Invention

The present invention relates to a method of forming a bitline and a bitline contact to a dynamic memory cell array, and a dynamic memory cell array having at least one bitline and a bitline contact manufactured by the method.

A schematic cross-sectional view of an exemplary single DRAM (Dynamic Random Access Memory) cell is shown in FIG. 4, wherein reference numeral 9 denotes a storage capacitor, reference numeral 10 denotes the source/drain region and reference numeral 18 denotes the gate electrode of a transistor. In FIG. 4, the storage capacitor 9 for storing information in the form of an electrical charge representing a logic value such as 0 or 1 is implemented as a trench capacitor. The trench capacitor is disposed in a trench 16 having a collar 11 preventing formation a parasitic capacitor, and having a surface strap 12 that also can be implemented as a buried strap so as to electrically connect the top electrode of the storage capacitor 9 with the source/drain region 10 of the transistor. A bitline 1 is connected via a bitline contact 2 with the source/drain region 10 of the transistor for reading the signal stored in the storage capacitor. The gate electrode 18 of the transistor is actuated by the wordline, which is not illustrated, to read the stored information from the capacitor 9. In a DRAM cell array and, in particular, a so-called embedded DRAM cell array, additional metalization layers such as the M1 metalization layer 15 are provided.

In the course of further development of DRAM cells and DRAM cell arrays, it has been attempted to increase the storage density of the memory cell array. As a condition of a further increase of the storage density, the area of the single memory cell has to shrink.

FIG. 6 shows the layout of an exemplary memory cell array implementing a so-called 8-$F^2$-cell architecture. The array includes a storage trench capacitor and a planar transistor for each of the memory cells. For each of the memory cells, an area of $8F^2$ is needed, wherein F denotes the smallest structural length that can be produced in the technology employed. The bitlines 1 are implemented as stripes and are extending parallel to each other, wherein the width as well as the distance between each of the bitlines amount to F, respectively. The word lines 6 each have a width as well as a distance to each other of F, respectively. The word lines 6 are disposed perpendicularly to the bitlines 1. The active areas 13 of each of the memory cells are disposed beneath the bitlines 1, and two wordlines 6 that are crossing each other above each of the active areas 13. The active areas 13 are disposed at staggered positions to each other beneath neighboring bitlines 1. A bitline contact 2 providing an electrical contact between the corresponding bitline 1 and the source/drain region 10 of the active area 13 is disposed in the middle of each of the active areas, respectively. The trenches 16 housing the trench capacitors 9 are disposed beneath the word lines 6. A gate electrode 18 of the corresponding transistor is disposed at the crossing points between one of the bitlines 1 and one of the wordlines 6 within the active areas 13.

The active areas 13 extend between two trenches 16. Each of the active areas 13 includes two transistors, which are connected with the corresponding bitline 1 via a common bitline contact 2. In dependence on the actuated wordline 6, the corresponding storage capacitor 9, which is disposed in one of the two trenches 16, is read.

Usually, in commonly used DRAM cell arrays, the bitlines as well as the bitline contacts are made of tungsten, and they are separated from each other by a dielectric material such as silicon dioxide.

FIGS. 5A and 5B illustrate the bitline and the bitline contact as manufactured by the prior-art dual damascene process. FIG. 5A shows a cross-section in a direction perpendicular to the wordlines 6. FIG. 5B shows a cross-section in a direction parallel to the wordlines 6.

In FIGS. 5A and 5B reference numeral 1 denotes a bitline, which forms part of the so-called M0 metalization layer, whereas reference numeral 2 denotes a bitline contact extending to the source/drain region 10 of the underlying transistor. Between the wordlines 6, a BPSG layer 3 is filled and planarized to provide an electrical insulation, and a first dielectric layer 4. The first dielectric layer 4 is normally silicon dioxide deposited by the TEOS (tetraethylorthosilicate) process. The first dielectric layer 4 is provided to electrically insulate the bitline contacts 2 and the bitlines 1 from each other.

According to the dual damascene process, the first dielectric layer 4 is deposited on the surface of the BPSG layer 3 filling the space between the wordlines 6. Then, a first photoresist material is applied, patterned to define the bitline contacts 2, and, then, the bitline contacts 2 are etched into the first dielectric layer 4. Afterward, the first photoresist material is removed. Next, a second photoresist material is applied and patterned to define the bitlines 1. Then, the bitlines 1 are etched into the first dielectric layer 4. In a following step, the second photoresist material is removed. Finally, the etched portions are filled with tungsten so as to provide the bitline contacts 2 and the bitlines 1 in one single step. Thereafter, a chemical mechanical polishing step is performed to remove the remaining tungsten material from the surface.

In the usually employed standard process of manufacturing DRAM cell arrays, next, a so-called retention anneal process is performed so as to remove crystal defects especially in the capacitor region of the DRAM cell whereby the retention time of the DRAM cell is set and, thus, the functionality of the DRAM cell is ensured. This retention anneal process is usually a furnace anneal process wherein the temperature is ramped up to temperatures higher than approximately 800° C.

Afterward, the other metalization layers such as the M1 (metalization 1) and the M2 (metalization 2) layers are deposited by known methods.

One problem associated with the conventionally employed bitlines made of tungsten is that the coupling of neighboring bitlines drastically increases with decreasing distances between them. This bitline coupling extremely reduces the device performance and thus is one of the most critical yield detractors in the shrinkage of DRAM cell size.

Hitherto, efforts have been made to increase the bitline layer thickness while at the same time reducing the line widths of the tungsten bitlines. Alternatively, it has been attempted to reduce the bitline coupling by twisting the bitlines at predetermined positions. Furthermore, it has been tried to improve the retention time of the DRAM cells by increasing the capacitance of the storage capacitor.

However, these measures have not given satisfactory results.

European Patent Application No. EP 0 730 298 A discloses a method of forming a bitline and a bitline contact. According to the method, after depositing a dielectric layer on the non-planarized surface of a DRAM memory cell array and forming a bitline contact, a wiring layer is formed. Subsequently, the second dielectric material is deposited and treated by a chemical mechanical polishing process to form a planarized surface. The second dielectric material is a low-k material, and the bitline contact is made of phosphorous-doped polysilicon.

In addition, International Publication Number WO 01/26139, which has a common assignee as the instant application, discloses a method of forming a bitline and a bitline contact. According to the method, the electrical contact between the bitlines and the source or drain portion of the DRAM cell is accomplished by first contact plugs of a conductive material, preferably polysilicon, and, additionally, by second contact plugs which are formed concurrently with bitlines in a dual damascene process. For forming the first contact plugs, a dielectric layer is deposited over the gate structures establishing the non-planarized surface of the DRAM cell array. Thereafter, openings are formed between the gate structures and the openings are filled with a conductive material.

In U.S. Pat. No. 5,712,201 to Lee et al., tungsten plugs extending to the source or drain portions of the DRAM cell are provided. Subsequently, a metal layer of aluminum having a low copper content is deposited and patterned to form bitline contacts.

According to German Published, Non-Prosecuted Patent Application DE 199 48 571 A, which has a common assignee as the instant application, the bitline contacts are formed in an insulating material surrounding the gate electrodes, the gate electrodes establishing a non-planarized surface of the DRAM cell array. Thereafter, the bitlines are formed by depositing and correspondingly patterning an aluminum layer. The second dielectric is deposited after forming the bitline structure.

U.S. Pat. No. 5,846,881 issued to Sandhu, et al. relates to a metallization process in which TiSi is deposited by Chemical Vapor Deposition. In particular, this document discloses a method of forming a bitline contact of TiSi and a bitline of Al or an Al/Cu alloy. According to this embodiment, the bitline material is sputtered as a layer and subsequently patterned to form the bitlines. According to a further embodiment, the bitline contacts, as well as the bitlines (both made of TiSi), are formed by a dual damascene process.

SUMMARY OF THE INVENTION

It is accordingly an object of the invention to provide a method of forming a bitline and a bitline contact, and a dynamic memory cell including a bitline and bitline made contact according to the method that overcomes the hereinafore-mentioned disadvantages of the heretofore-known methods and devices of this general type and that provide a method of forming a bitline and a bitline contact having reduced bitline coupling between neighboring bitlines. Moreover, it is an object of the present invention to provide a dynamic random access memory cell array with reduced bitline coupling.

With the foregoing and other objects in view, there is provided, in accordance with the invention, a method of forming a bitline and a bitline contact for a dynamic memory cell array. The method includes the following steps. The first step is providing the dynamic memory cell array including a plurality of memory cells formed in juxtaposition on a semiconductor substrate and being insulated from each other by an insulating material; each of the memory cells includes a storage capacitor as well as a transistor having a source, a drain, and a gate portion; the memory cell array has a planarized surface. The next step is depositing a first dielectric layer on the planarized surface of the memory cell array. The subsequent step is defining a contact hole in the first dielectric layer penetrating through the first dielectric layer. The next step is filling the contact hole with a first conductive material so as to form a bitline contact; the first conductive material electrically contacts one of the source and drain portions of the transistor. The next step is depositing a second dielectric layer on a surface of the first dielectric layer. Thereafter, the next step is defining a wiring structure of a second conductive material having a higher conductivity than the first conductive material in the second dielectric layer to form the bitline.

With the objects of the invention in view, there is also provided a dynamic memory cell array having at least one bitline. The dynamic memory cell array includes a plurality of memory cells juxtaposed on a semiconductor substrate and being insulated from each other by an insulating material therebetween. Each of the memory cells includes a storage capacitor as well as a transistor having a source, a drain, and a gate portion. The bitline electrically contacts the source or drain portion of at least one of the memory cells via at least one bitline contact. The bitline contact includes a first dielectric layer deposited on the planarized surface of the memory cell array. At least one contact hole in the first dielectric layer entirely penetrates the first dielectric layer and is filled with a first conductive material. The first conductive material is in electrical contact with the source or drain portion of the at least one memory cell, so as to form the bitline contact, a second dielectric layer on the surface of the first dielectric layer, and a wiring structure of a second conductive material having a higher conductivity than the first conductive material in the second dielectric layer.

The present invention is based on the knowledge that bitline coupling depends in a first approximation on the product of resistance of the wiring and the coupling (capacitance) thereof. At a given bitline material, the resistance thereof could be lowered by raising the height of the conductive stack. This measure in turn will increase the coupling to the opposing line.

Accordingly, introducing a new material for the bitline wiring will reduce the bitline coupling when the new material has a lower resistivity than tungsten, which is commonly used as the bitline contact material. In particular, copper has a resistivity that is approximately one tenth of tungsten. Additionally, the bitline coupling can further be reduced by introducing a dielectric having a low dielectric constant (so-called low-k dielectric).

However, previously two major reasons prevented these measures.

On one hand, in the conventionally employed dual damascene process the bitline contact material and the bitline material are deposited in one single process step and they are made of one single material. However, especially copper or aluminum cannot be employed as this single material because problems concerning diffusion will occur when copper or aluminum is deposited in contact with silicon.

On the other hand, low resistivity materials such as copper and aluminum as well as low-k materials do not withstand the retention anneal process which has to be performed as mentioned above. In particular, copper as well as low-k materials become thermally instable at temperatures above 500° C.

As the inventor of the present invention discovered, the above problems can be handled if the dual damascene process is replaced with a two-step process in which, first, the bitline contact is established in a first dielectric layer and, then, the bitline is defined in a second dielectric layer, the bitline material having a lower resistivity than the bitline contact material.

To this end, the first dielectric layer is deposited on the planarized surface of the DRAM cell array. The planarized surface of the DRAM cell array can be established by wordlines 6 that are surrounded by spacers 17 and having an insulating material such as a BPSG layer 3 therebetween, as is shown in FIG. 1A. In this case, when defining a contact hole entirely penetrating the first dielectric layer, subsequently, also the BPSG layer 3 has to be etched in order to achieve electrical contact to the source or drain portion.

In addition, forming contact plugs filled with a conductive material are formed between the wordlines is within the scope of the invention. For example, contact plugs can be formed in every other position. In this case, when defining a contact hole, only the first dielectric layer has to be etched. After filling the contact hole with a conductive material, electrical contact to the source or drain portion is established.

According to the present invention, the first and second dielectric layers can be made of the same dielectric such as silicon dioxide deposited with the TEOS process. Nevertheless, it is preferred that the second dielectric layers has a smaller dielectric constant than the first dielectric layer so as to further reduce bitline coupling. In particular, it is preferred that the second dielectric layer is made of a so-called low-k material.

In case the method of forming a bitline and a bitline contact of the present invention is to be incorporated in the presently used standard DRAM process, it is further preferred that the retention anneal process is performed before employing a temperature sensitive material. In particular, if a low-k dielectric is used as the second dielectric layer, this retention anneal process is performed after filling the contact holes with the first conductive material and before depositing the second dielectric layer on the surface of the first dielectric layer. In this case, the second dielectric layer as well as the second conductive material is deposited after this high temperature step and the stability of these materials will not be affected. On the other hand, if the material used as the second dielectric layer withstands the temperatures prevailing during the retention anneal process, this process can also be performed after depositing the second dielectric layer and before defining the bitlines.

However, depending on the specific DRAM process used, this step can also be performed at another time, can be possibly completely dispensed with or can be modified so as not to affect the temperature sensitive material employed.

Accordingly, the present invention, in which the step of providing the bitline contact material is separated from the step of providing the bitline material, provides the advantage that the resistance of the bitlines can remarkably be reduced because the bitlines are made of a conductive material having a lower resistivity than that of the bitline contact. Thereby, the bitline coupling can be reduced. If the dielectric between the bitlines is additionally made of a low-k dielectric, the bitline coupling can further be remarkably reduced.

According to a preferred embodiment of the present invention, in which the retention anneal process is performed before depositing the conductive material or even before applying the low-k dielectric, there is no high temperature step to be performed after depositing these materials so that the reduced temperature stability of these materials will not involve any problem.

Other features which are considered as characteristic for the invention are set forth in the appended claims.

Although the invention is illustrated and described herein as embodied in method of forming a bitline and a bitline contact, and dynamic memory cell including a bitline and bitline made contact according to the method, it is nevertheless not intended to be limited to the details shown because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
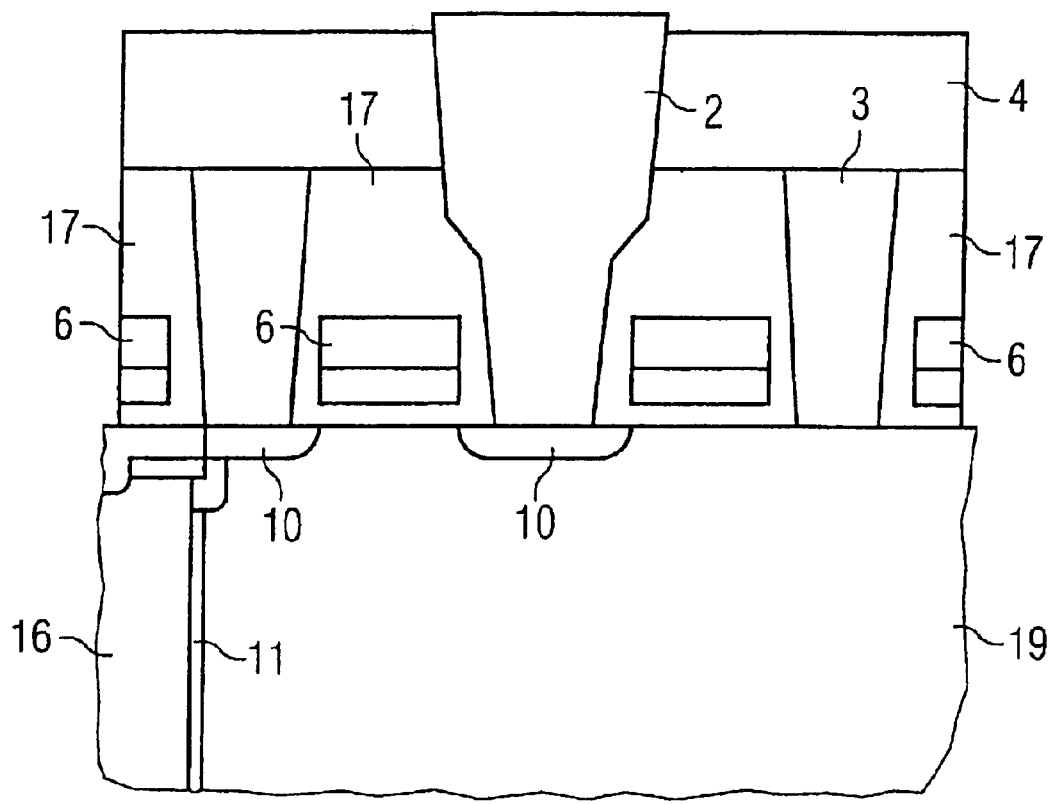
FIGS. 1 to 3 are partial schematic and partial diagrammatic sectional views showing the steps of the method of forming a bitline and a bitline contact according to the present invention.

Referring now to the figures of the drawings in detail and first, particularly to FIG. 1A thereof, there is shown a partial schematic and partial diagrammatic sectional view of the upper part of an exemplary DRAM cell array in a direction perpendicular to the wordlines 6, the components of the storage capacitor as well as of the transistor have already been formed by known methods.

In particular, reference numeral 16 denotes the trench formed in the silicon substrate 19 to house the storage capacitor. Reference numeral 11 denotes a collar region as conventionally employed, reference numeral 10 denotes the source/drain region of the transistor and reference numeral 6 denotes a wordline actuating the gate electrode of the transistor. A silicon nitride spacer 17 is provided as is conventional. A BPSG material 3 fills between the wordlines 6. All these components are provided by prior-art methods and, of course, can be replaced by different components as generally employed. The substrate 19 includes regions having appropriate doping levels, which are omitted for simplicity.

According to the method of the present invention, the first dielectric layer 4 is deposited on the planarized surface of the DRAM cell array having the BPSG layer 3 between the wordlines 6, which are surrounded by the spacers 17, respectively. It lies within the scope of the present invention that after the deposition of the BPSG layer 3 the surface of the memory cell array is planarized so that possibly part of the BPSG layer 3 may still remain on top of the spacers 17. In this case, the first dielectric layer 4 is deposited on top of the planarized surface of the BPSG layer 3.

The first dielectric layer 4 can for example be provided by a chemical vapor deposition process using TEOS (tetraethylorthosilicate) to form a $SiO_2$ layer. In the next step, a contact hole extending to the source/drain region 10 of the transistor is defined in the first dielectric layer 4. The contact hole penetrates the dielectric layer 4 entirely.

This can for example be accomplished by applying a photoresist material on the surface of the first dielectric layer, photolithographically defining the contact holes in the photoresist material, etching the contact holes in the first dielectric layer 4 and in the BPSG layer 3 and, then, removing the photoresist material. Then, the contact hole is filled with the first conductive material, which is usually tungsten. This can also be accomplished by a selective CVD process wherein tungsten is only deposited at those locations at which a seed layer was applied before. Thereafter, a chemical mechanical polishing (CMP) process is performed to remove the tungsten from the portions outside the contact holes.

Figure 1B:
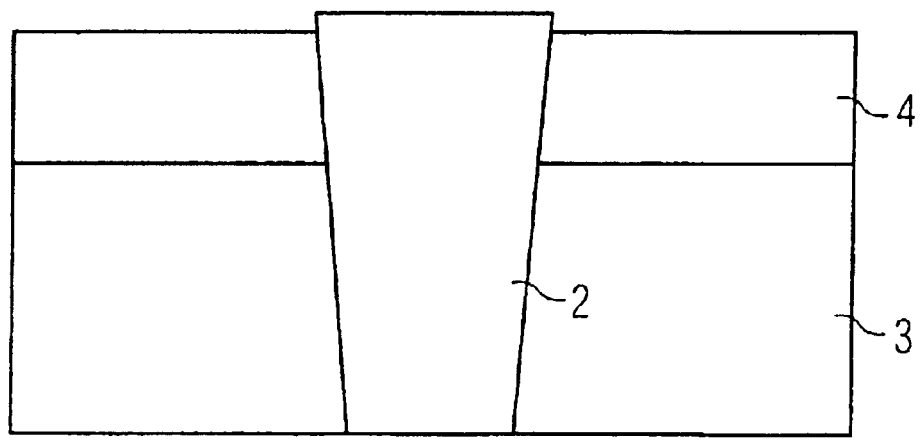

FIGS. 1A and 1B show the resulting structures, wherein FIG. 1A shows a cross-section in a direction perpendicular to the wordline 6, whereas FIG. 1B shows a cross-section in a direction parallel to the wordline 6.

According to a first embodiment of the present invention, in the next step the second dielectric layer, which is made of the same material as the first dielectric layer, is deposited by a chemical vapor deposition process using TEOS. Thereafter, the retention anneal process is performed. As mentioned above, this process is a furnace anneal process in which the wafers are heated to a temperature above 800° C. in a furnace, for example in a nitrogen atmosphere.

According to a second embodiment of the present invention, the second dielectric layer is a so-called low-k dielectric. Examples for such dielectric materials include silicon dioxide doped with carbon (SiCOH) having a dielectric constant from 2.6 to 2.8, halogen doped silicon dioxide or others as known in the art. Hence, in order to avoid a decomposition of this dielectric layer, according to the described process, it is necessary to perform the retention anneal process before depositing the second dielectric layer.

After the retention anneal process has been performed as described above, the low-k dielectric is deposited according to commonly employed methods. For example, a chemical vapor deposition process may be performed in order to deposit SiCOH, or the dielectric may be applied as a spin-on glass (SOG) as is generally known.

Figure 2:
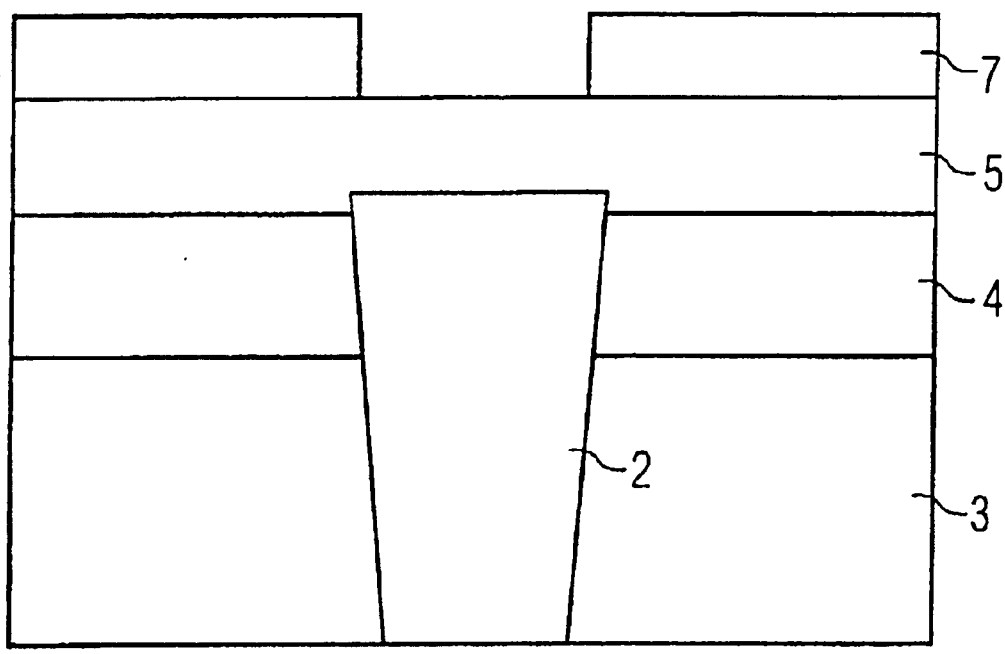
Figure 3:
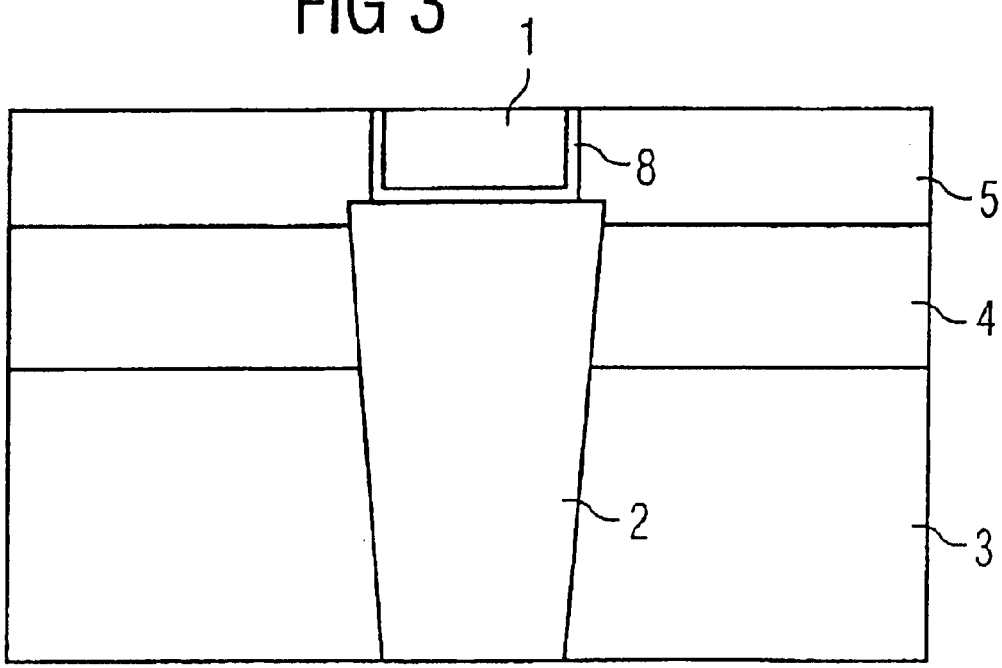
Figure 4:
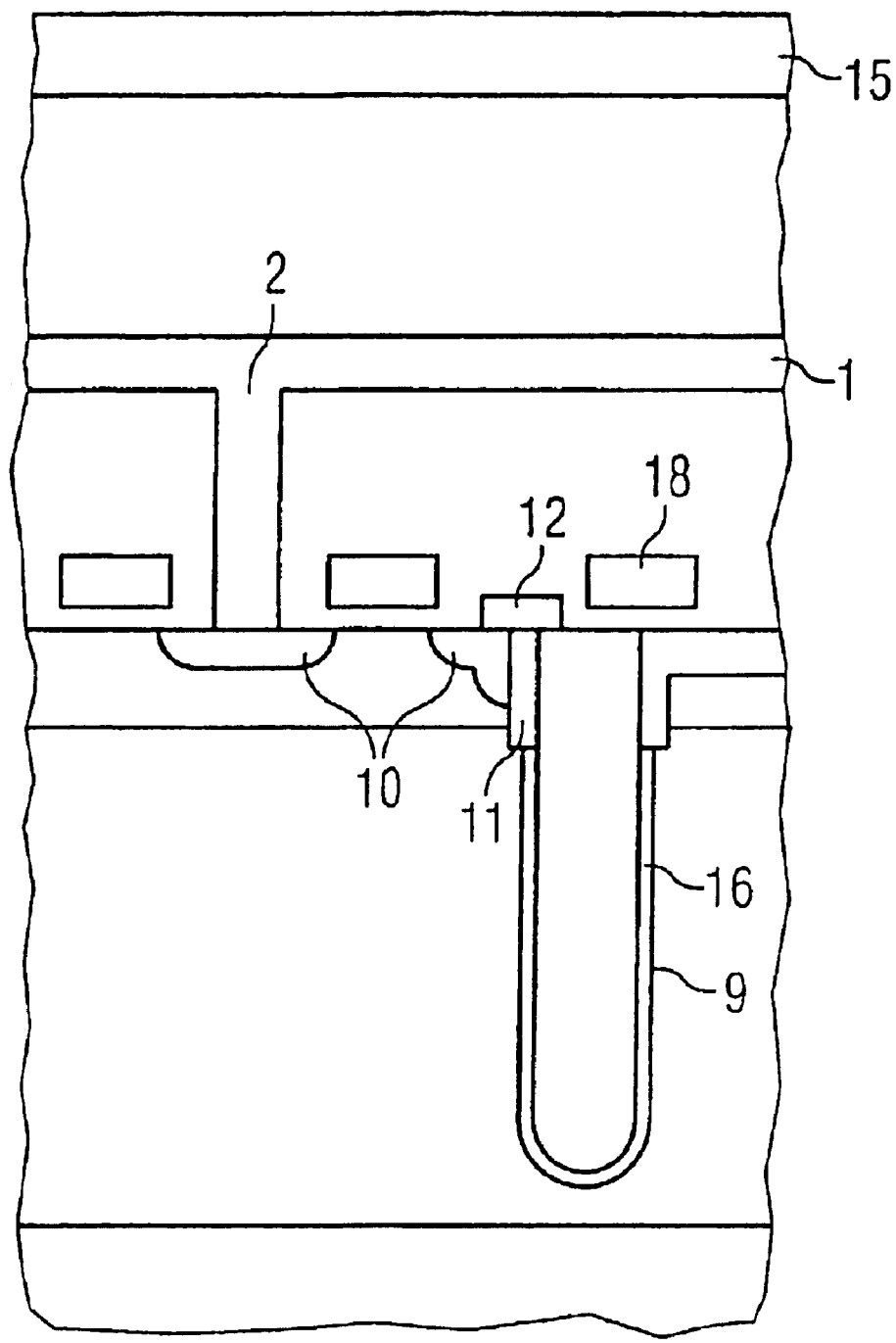
FIG. 4 is a partial diagrammatic and partial schematic sectional view showing a prior-art DRAM cell.
Figure 5A:
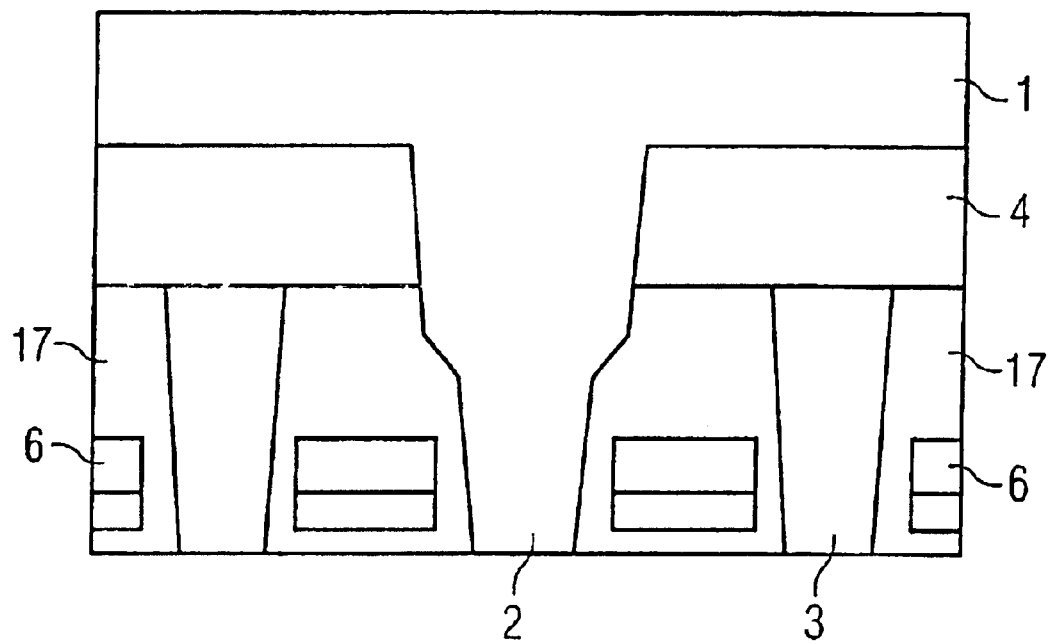
FIGS. 5A and 5B are diagrammatic sectional views showing a prior-art bitline and bitline contact.
Figure 5B:
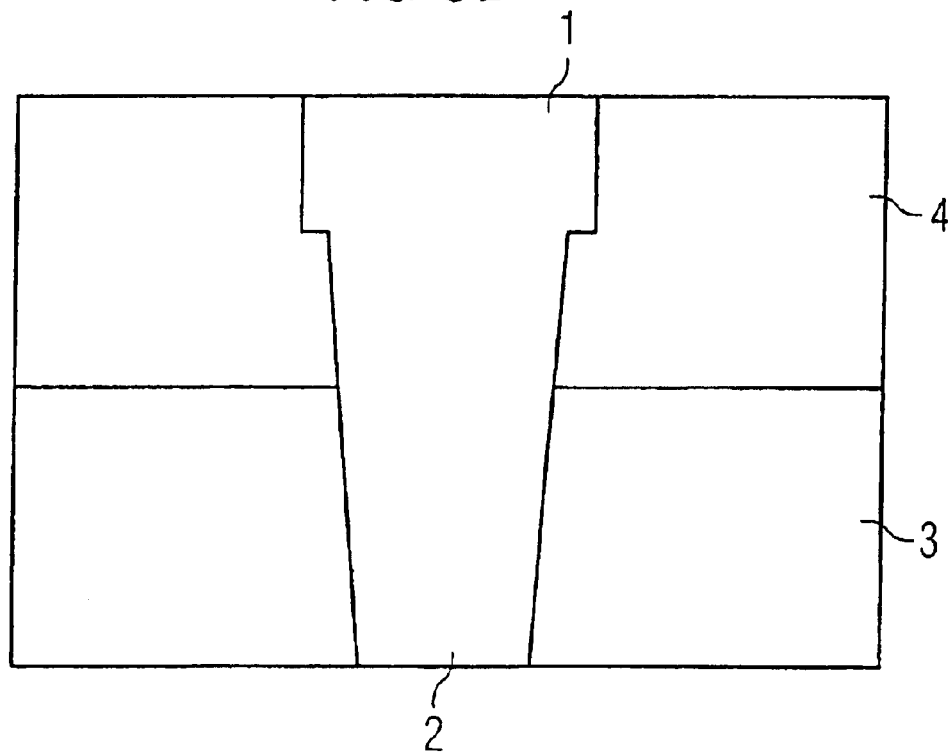
Figure 6:
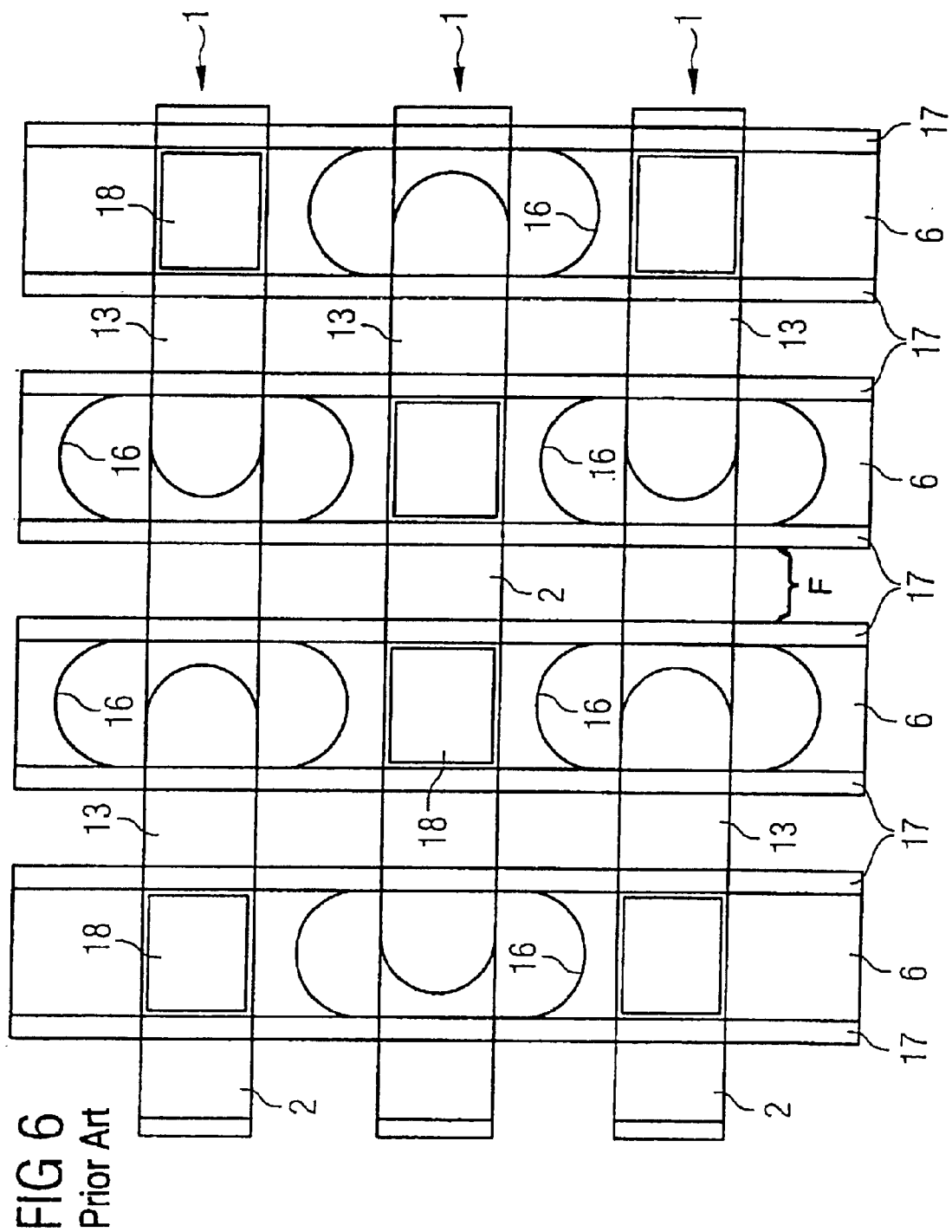
FIG. 6 is a diagrammatic plan view showing a prior-art memory cell array.

Then, according to both embodiments, the bitlines will be defined in the second dielectric layer. To this end, preferably the standard single damascene process is performed. Accordingly, first, a photoresist material 7 is applied and patterned, as is shown in FIG. 2 and the second dielectric layer 5 is etched at the exposed portions. Since the resistivity of the second conductive material is lower than that of the first conductive material, the diameter of the bitlines can be made smaller than the upper diameter of the bitline contact, as is indicated in FIG. 3. FIGS. 2 and 3 show cross-sectional views in a direction parallel to the wordline 6.

Then, the photoresist material 7 is removed and the second conductive material, which is preferably copper, aluminum, or an alloy including copper and aluminum, is filled into the etched portions of the second dielectric layer 5. In order to avoid that the second conductive material diffuses into the second dielectric layer, preferably a liner 8 such as a $Ta_2O_5$ liner having a small thickness is deposited.

Copper can for example be deposited by first depositing a seed layer and then depositing copper by an electroplating process. Alternatively, also a chemical vapor deposition process of copper can be performed.

As a further modification, also aluminum having a small amount of copper (approximately 0.3%) can be employed as the second conductive material.

A chemical mechanical polishing step is performed to remove the second conductive material from the portions outside the etched bitline regions.

The resulting structure is shown in FIG. 3.

Accordingly, a bitline as well as a bitline contact have been formed by a process, whereby the coupling between neighboring bitlines has largely been reduced.

In the following, the usually employed process steps for providing the further metalization layers will be performed.

I claim:

1. A method of forming bitlines and bitline contacts for dynamic memory cell arrays, the method which comprises:
   providing a dynamic memory cell array including a planarized surface, a plurality of juxtaposed memory cells on a semiconductor substrate, each having a storage capacitor formed in a trench in the substrate and a transistor with a source, a drain, and a gate portion;
   insulating the memory cells from each other with an insulating material;
   depositing a first dielectric layer on the planarized surface of the memory cell array, the first dielectric layer having a surface;
   subsequently forming a contact hole in the first dielectric layer penetrating through the first dielectric layer;
   filling the contact hole with a first conductive material to form a bitline contact;
   electrically contacting the first conductive material with one of the source and drain portions of the transistor;
   annealing the substrate at a temperature above 800° C. after filling the contact holes with the first conductive material; and
   after annealing the substrate, depositing a second dielectric layer, which has a smaller dielectric constant than the first dielectric layer, on the surface of the first dielectric layer; and
   thereafter defining a wiring structure of a second conductive material having a higher conductivity than the first conductive material in the second dielectric layer to form the bitline.

2. The method according to claim 1, wherein the first conductive material is tungsten.

3. The method according to claim 1, wherein the second conductive material is selected from the group consisting of aluminum, copper, and an alloy including aluminum and copper.

4. The method according to claim 1, wherein the second dielectric layer has a dielectric constant less than 4.

5. The method according to claim 1, which further comprises annealing the substrate at a temperature higher than 800° C. before defining the wiring structure of the second conductive material.

6. The method according to claim 1, wherein the step of defining a wiring structure of a second conductive material in the second dielectric layer further comprises:
   applying a photoresist material on the surface of the second dielectric layer;
   lithographically defining the wiring structures in the photoresist material to expose portions of the second dielectric layer;

selectively etching the second dielectric layer in the exposed portions; and filling the etched portions with the second conductive material.

7. A method of forming bitlines and bitline contacts for dynamic memory cell arrays, the method which comprises:

providing a dynamic memory cell array including a planarized surface, a plurality of juxtaposed memory cells on a semiconductor substrate, each having a storage capacitor formed in a trench in the substrate and a transistor with a source, a drain, and a gate portion;

insulating the memory cells from each other with an insulating material;

depositing a first dielectric layer on the planarized surface of the memory cell array, the first dielectric layer having a surface;

subsequently forming a contact hole in the first dielectric layer penetrating through the first dielectric layer;

filling the contact hole with a first conductive material to form a bitline contact;

electrically contacting the first conductive material with one of the source and drain portions of the transistor;

depositing a second dielectric layer on the surface of the first dielectric layer;

after depositing the second dielectric layer, annealing the substrate at a temperature higher than 800° C.; and after annealing the substrate, defining a wiring structure of a second conductive material having a higher conductivity than the first conductive material in the second dielectric layer to form the bitline.

8. The method according to claim 7, wherein the first conductive material is tungsten.

9. The method according to claim 7, wherein the second conductive material is selected from the group consisting of aluminum, copper, and an alloy including aluminum and copper.

10. The method according to claim 7, wherein the second dielectric layer has a dielectric constant less than 4.

11. The method according to claim 7, wherein the step of defining a wiring structure of a second conductive material in the second dielectric layer further comprises:

applying a photoresist material on the surface of the second dielectric layer;

lithographically defining the wiring structures in the photoresist material to expose portions of the second dielectric layer;

selectively etching the second dielectric layer in the exposed portions; and filling the etched portions with the second conductive material.

* * * * *